United States Patent
Li (10) Patent No.: US 12,324,139 B2
(45) Date of Patent: Jun. 3, 2025

(54) METHOD FOR MANUFACTURING SEMICONDUCTOR DEVICE AND SEMICONDUCTOR DEVICE

(71) Applicant: CHANGXIN MEMORY TECHNOLOGIES, INC., Hefei (CN)

(72) Inventor: Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 457 days.

(21) Appl. No.: 17/806,980

(22) Filed: Jun. 15, 2022

(65) Prior Publication Data

US 2023/0225101 A1  Jul. 13, 2023

Related U.S. Application Data

(63) Continuation of application No. PCT/CN2022/080311, filed on Mar. 11, 2022.

(30) Foreign Application Priority Data

Jan. 12, 2022  (CN) .......................... 202210031315.7

(51) Int. Cl.
H10B 12/00  (2023.01)

(52) U.S. Cl.
CPC ............. H10B 12/01 (2023.02); H10B 12/50 (2023.02)

(58) Field of Classification Search
None
See application file for complete search history.

(56) References Cited

U.S. PATENT DOCUMENTS

| | | | |
|---|---|---|---|
| 7,528,024 B2 | 5/2009 | Colombo | |
| 10,332,831 B2 | 6/2019 | Hong | |
| 2005/0258468 A1 | 11/2005 | Colombo | |
| 2018/0122806 A1* | 5/2018 | Li | .......................... H01L 29/518 |
| 2018/0158773 A1 | 6/2018 | Hong et al. | |

FOREIGN PATENT DOCUMENTS

| | | |
|---|---|---|
| CN | 102299155 A | 12/2011 |
| CN | 104377236 A | 2/2015 |
| CN | 108022882 A | 5/2018 |
| CN | 108155173 A | 6/2018 |
| CN | 109728078 A | 5/2019 |
| CN | 110233098 A | 9/2019 |
| CN | 112635401 A | 4/2021 |
| JP | 4607637 B2 | 1/2011 |
| KR | 20090048189 A | 5/2009 |

OTHER PUBLICATIONS

Wu et al., Investigation of ALD or PVD (Ti-rich vs. N-rich) TiN Metal Gate Thermal Stability on HfO2 High-K, 2010 IEEE, School of EEE, NTU, Nanyang Avenue, Singapore 639798, TSMC, 8, Li-Shin Rd., 6, Hsinchu, Taiwan, R.O.C.

* cited by examiner

*Primary Examiner* — Hsien Ming Lee
(74) *Attorney, Agent, or Firm* — Syncoda LLC; Feng Ma (57) ABSTRACT

A method for manufacturing a semiconductor device includes providing a semiconductor substrate including a first and second regions; forming a first dielectric layer on the semiconductor substrate; forming a temporary layer on the first dielectric layer; performing a first heat treatment process on the first dielectric layer and the temporary layer; removing the temporary layer to expose the first dielectric layer; and performing a second heat treatment process on the first dielectric layer.

15 Claims, 10 Drawing Sheets

METHOD FOR MANUFACTURING SEMICONDUCTOR DEVICE AND SEMICONDUCTOR DEVICE

CROSS-REFERENCE TO RELATED APPLICATIONS

This application is a U.S. continuation application of International Application No. PCT/CN2022/080311 filed on Mar. 11, 2022, which claims priority to Chinese Patent Application No. 202210031315.7 filed on Jan. 12, 2022. The disclosures of these applications are hereby incorporated by reference in their entirety.

BACKGROUND

A Dynamic Random Access Memory (DRAM) is a semiconductor memory device commonly used in computers, and consists of a large number of repeated memory cells. Each memory cell typically includes a capacitor and a metal oxide semiconductor (MOS). A semiconductor substrate includes an array area and a peripheral area. The MOS is arranged in the array area and the peripheral area, and includes a NMOS (N-Metal-Oxide-Semiconductor) and a PMOS (P-Metal-Oxide-Semiconductor).

In a manufacturing process of the DRAM, forming the MOS may damage the surface of a dielectric layer, resulting in interface defects. In addition, the dielectric layer may be contaminated by materials used in the process, resulting in impurity of the dielectric layer, which in turn affects the performance of the semiconductor device and reduces the yield rate thereof.

SUMMARY

The disclosure relates to the technical field of semiconductor manufacturing, and in particular to a method for manufacturing a semiconductor device and the semiconductor device.

Embodiments of the disclosure provide a method for manufacturing a semiconductor device.

Embodiments of the disclosure also provide a semiconductor device manufactured by the above method.

According to an aspect of the disclosure, a method for manufacturing a semiconductor device is provided. The method includes the following operations. A semiconductor substrate including a first region and a second region is provided. A first dielectric layer is formed on the semiconductor substrate. A temporary layer is formed on the first dielectric layer. A first heat treatment is performed on the first dielectric layer and the temporary layer. The temporary layer is removed to expose the first dielectric layer. A second heat treatment is performed on the first dielectric layer. The formation of the temporary layer includes the following operations: forming a first protective layer on the first dielectric layer, forming a first work function layer and a second protective layer on the first protective layer located in the first region in sequence, forming a second work function layer and a third protection layer on the first protection layer located in the second region and the second protection layer located in the first region in sequence, forming a conductive layer on the third protective layer.

According to another aspect of the disclosure, a semiconductor device is provided. The semiconductor device is manufactured by the method described in any of the above embodiments.

BRIEF DESCRIPTION OF THE DRAWINGS

The above features and advantages, and other features and advantages of the disclosure will be more apparent from the detailed description of exemplary embodiments with reference to the accompanying drawings.

DETAILED DESCRIPTION

Exemplary embodiments will be described more comprehensively with reference to the accompanying drawings. However, the exemplary embodiments can be implemented in various forms, and should not be limited to those set forth herein. Instead, these embodiments are provided to make the disclosure comprehensive and complete, and fully convey the concept of exemplary embodiments to those skilled in the art. The same reference numerals in the drawings denote the same or similar structures, so their detailed description is omitted.

Various exemplary embodiments of the disclosure are descripted as follows with reference to the accompanying drawings. The drawings form a part of the disclosure, and show different exemplary structures that can implement various aspects of the disclosure may in an exemplary way. It should be understood that other specific solutions of components, structures, exemplary devices, systems, and steps may be used, and structural and functional modifications may be made without departing from the scope of this disclosure. Moreover, although the terms "on", "between" and "in" are used in the specification to describe different exemplary features and elements of the disclosure, these terms are used here only for convenience, indicating such as the exemplary directions shown in the drawings. Nothing in the specification should be understood as requiring a specific three-dimensional orientation of the structure to fall within the scope of this disclosure. In addition, the terms "first" and "second" in the claims are only used as signs, instead of numerical restrictions on their objects.

The flowcharts shown in the accompanying drawings are only exemplary illustrations, and neither necessarily include all contents and operations/steps, nor do they have to be performed in the order described. For example, some operations/steps may be broken down, and some operations/steps may be combined or partially combined, so the actual execution order may change depending on actual practices.

In addition, in the description of this disclosure, the expression "a plurality of" means at least two, such as two, three and so on, unless otherwise specifically defined. The terms "above" and "below" are technical terms used to indicate orientation, and are only used for a clearer description, without limiting effect.

Figure 1:
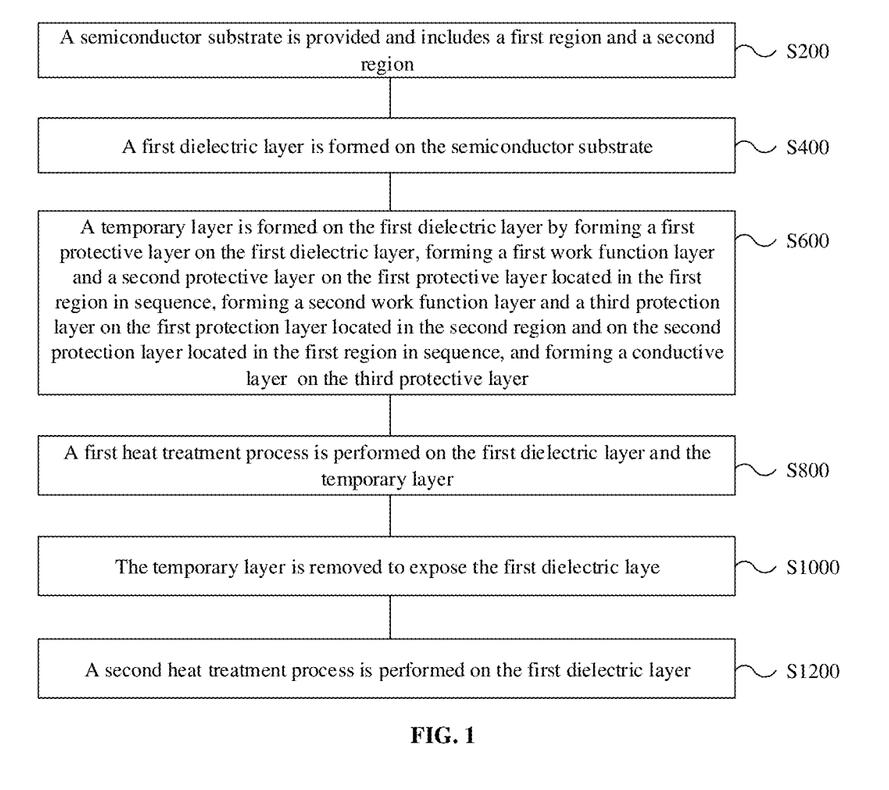
FIG. 1 shows a flowchart of a method for manufacturing a semiconductor device of an exemplary embodiment of the disclosure.

According to an aspect of the disclosure, a method for manufacturing a semiconductor device is provided. As for FIGS. 1 to 10E, FIG. 1 shows a flowchart of a method for manufacturing a semiconductor device of an embodiment of the disclosure; and FIGS. 2A to 10E schematically show structures of a semiconductor device in a manufacturing procedure of an embodiment of the disclosure. As shown in FIG. 1, the method for manufacturing a semiconductor device of an embodiment of the disclosure includes the following operations S200, S400, S600, S800, S1000, and S1200.

At S200, a semiconductor substrate 11 including a first region A1 and a second region A2 is provided.

At S400, a first dielectric layer 2 is formed on the semiconductor substrate 11.

At S600, a temporary layer 3 is formed on the first dielectric layer 2. The operations S602, S604, S606, and S608 are included.

At S602, a first protective layer 31 is formed on the first dielectric layer 2.

At S604, a first work function layer 32 and a second protective layer 33 are formed on the first protective layer 31 located in the first region A1 in sequence.

At S606, a second work function layer 34 and a third protection layer 35 are formed on the first protection layer 31 located in the second region A2 and the second protection layer 33 located in the first region A1 in sequence.

At S608, a conductive layer 36 is formed on the third protective layer 35 to form the temporary layer 3.

At S800, a first heat treatment process is performed on the first dielectric layer 2 and the temporary layer 3.

At S1000, the temporary layer 3 is removed to expose the first dielectric layer 2.

At S1200, a second heat treatment process is performed on the first dielectric layer 2.

For the method for manufacturing a semiconductor device according to the embodiment of the disclosure, it is avoided that the work function layer is directly formed on the first dielectric layer 2 by forming the first protective layer 31 on the first dielectric layer 2, which protects the first dielectric layer 2, and makes it easier to remove the temporary layer 3 in the subsequent process. It can be avoided that the second work function layer 34 located in the first region A1, during the first heat treatment process, diffuses into the first dielectric layer 2 located in the first region A1 by forming the second protective layer 33 on the first work function layer 32, which ensures the purity of the first work function layer 32. In addition, the second heat treatment process is performed on the first dielectric layer 2 exposed after removing the temporary layer 3, which can repair the first dielectric layer 2, reduce interface defects, and improve the purity of the first dielectric layer, thereby ensuring the performance stability of the semiconductor device and improving the yield rate of the semiconductor device.

The method for manufacturing a semiconductor device of the embodiment of the disclosure is described in detail below.

At S200, a semiconductor substrate 11 including a first region A1 and a second region A2 is provided.

As shown in FIGS. 2A to 2E, the material of the semiconductor substrate 11 of the semiconductor device of the embodiment of the disclosure may be silicon, silicon carbide, silicon nitride, silicon-on-insulator, cascaded silicon-on-insulator, cascaded silicon-germanium-on-insulator, silicon germanium-on-insulator or germanium-on-insulator, etc. The semiconductor substrate 11 may also be implanted with certain doping-particles according to design requirements to change electrical parameters.

Further, the semiconductor substrate 11 of the embodiment of the disclosure includes a peripheral area and an array area A3. Shallow trench isolations may be formed in the array area A3, and an active region is arranged between the shallow trench isolations. Semiconductor structures such as a word line structure, a bit line structure, and a transistor may be formed in the array area A3. Semiconductor structures such as a peripheral circuit and the transistor may be formed in the peripheral area.

Figure 2A:
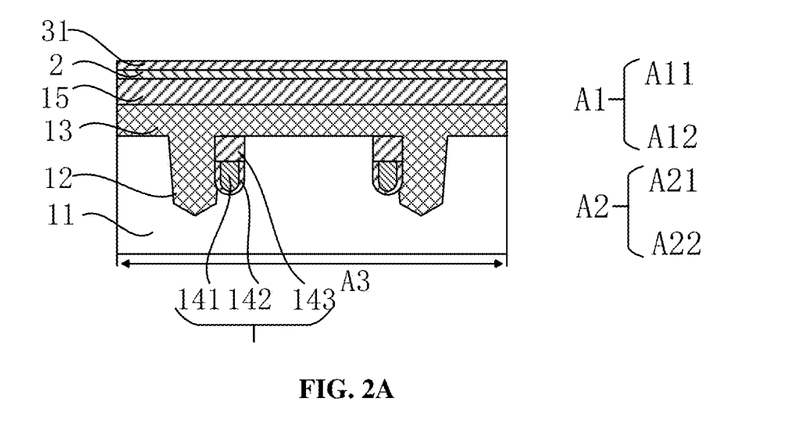
FIG. 2A is a first schematic illustration showing the formation of a first dielectric layer and a first protective layer on a semiconductor substrate according to an exemplary embodiment of the disclosure.
Figures 2B, 2C:
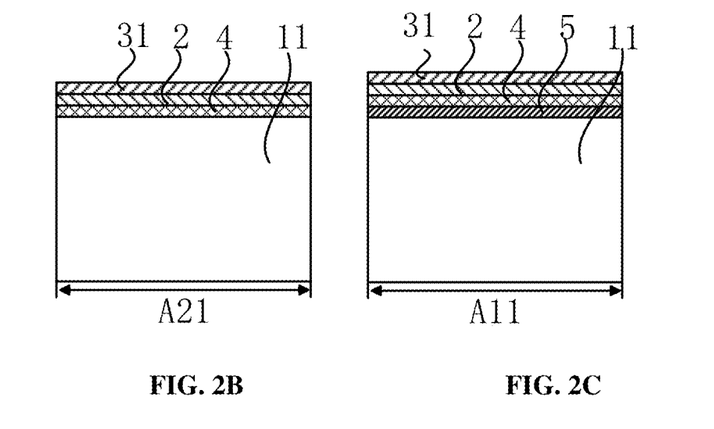
FIG. 2B is a second schematic illustration showing the formation of a first dielectric layer and a first protective layer on a semiconductor substrate according to an exemplary embodiment of the disclosure.
FIG. 2C is a third schematic illustration showing the formation of a first dielectric layer and a first protective layer on a semiconductor substrate according to an exemplary embodiment of the disclosure.
Figures 2D, 2E:
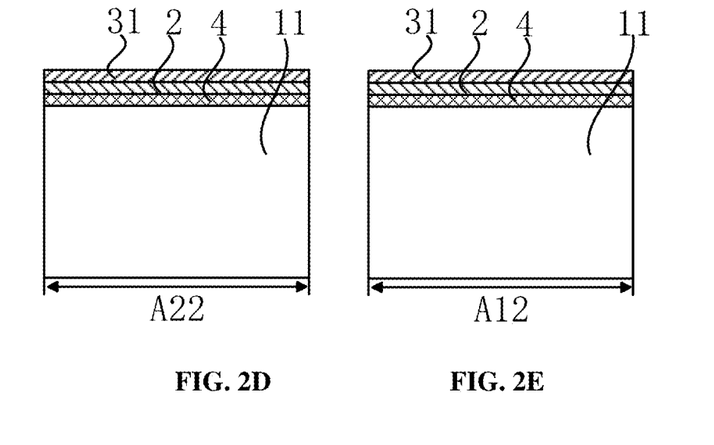
FIG. 2D is a fourth schematic illustration showing the formation of a first dielectric layer and a first protective layer on a semiconductor substrate according to an exemplary embodiment of the disclosure.
FIG. 2E is a fifth schematic illustration showing the formation of a first dielectric layer and a first protective layer on a semiconductor substrate according to an exemplary embodiment of the disclosure.
Figure 3A:
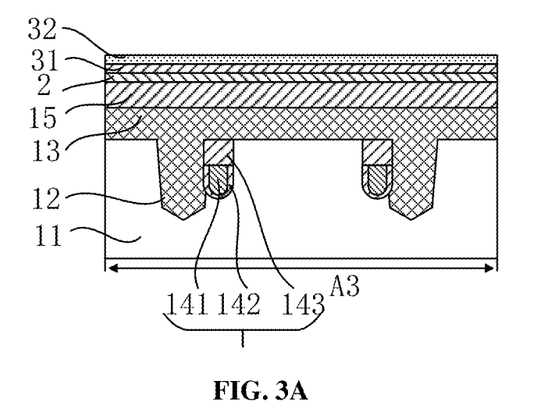
FIG. 3A is a first schematic illustration showing a structure during the formation of a first work function layer of a semiconductor device according to an exemplary embodiment of the disclosure.
Figure 3B:
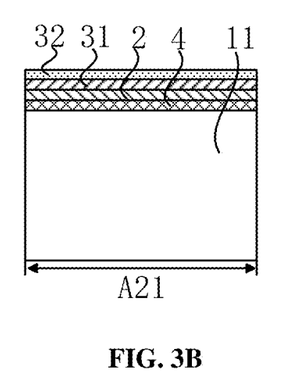
FIG. 3B is a second schematic illustration showing a structure during the formation of a first work function layer of a semiconductor device according to an exemplary embodiment of the disclosure.
Figure 3C:
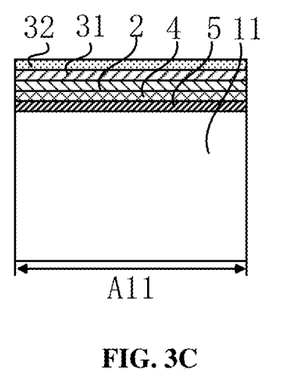
FIG. 3C is a third schematic illustration showing a structure during the formation of a first work function layer of a semiconductor device according to an exemplary embodiment of the disclosure.
Figure 3D:
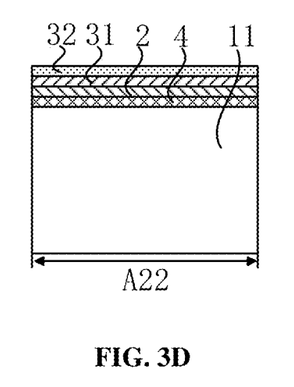
FIG. 3D is a fourth schematic illustration showing a structure during the formation of a first work function layer of a semiconductor device according to an exemplary embodiment of the disclosure.
Figure 3E:
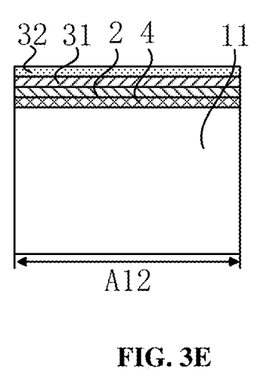
FIG. 3E is a fifth schematic illustration showing a structure during the formation of a first work function layer of a semiconductor device according to an exemplary embodiment of the disclosure.
Figure 4A:
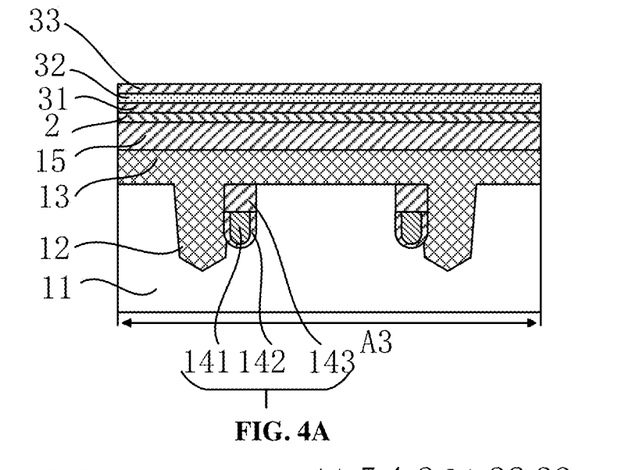
FIG. 4A is a first schematic illustration showing a structure during the formation of a second protective layer of a semiconductor device according to an exemplary embodiment of the disclosure.
Figure 4B:
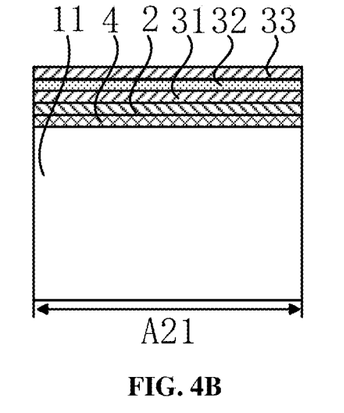
FIG. 4B is a second schematic illustration showing a structure during the formation of a second protective layer of a semiconductor device according to an exemplary embodiment of the disclosure.
Figure 4C:
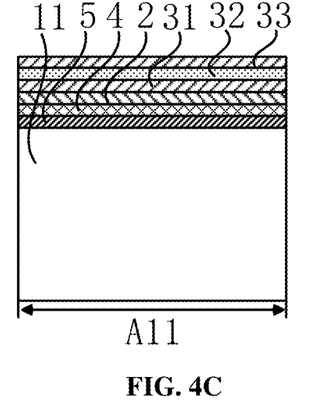
FIG. 4C is a third schematic illustration showing a structure during the formation of a second protective layer of a semiconductor device according to an exemplary embodiment of the disclosure.
Figure 4D:
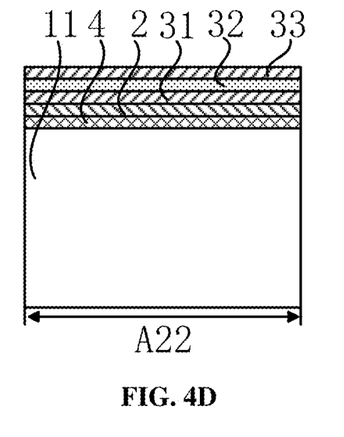
FIG. 4D is a fourth schematic illustration showing a structure during the formation of a second protective layer of a semiconductor device according to an exemplary embodiment of the disclosure.
Figure 4E:
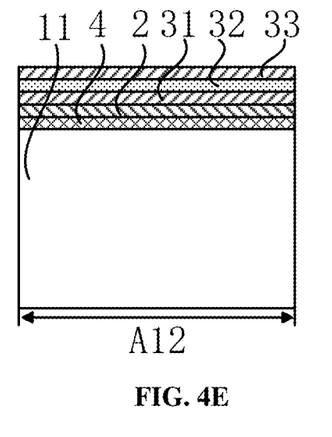
FIG. 4E is a fifth schematic illustration showing a structure during the formation of a second protective layer of a semiconductor device according to an exemplary embodiment of the disclosure.
Figure 5A:
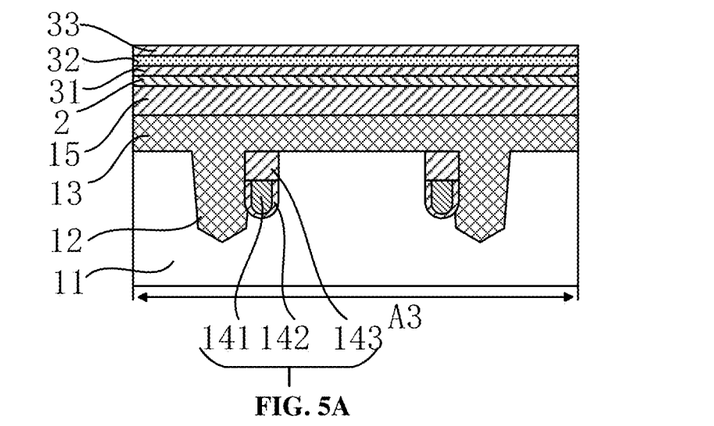
FIG. 5A is a first schematic illustration showing a structure during the formation of a second protective layer of a semiconductor device according to an exemplary embodiment of the disclosure.
Figure 5B:
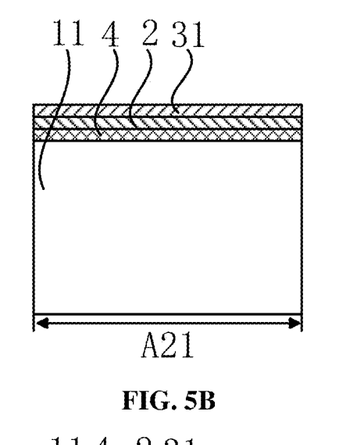
FIG. 5B is a second schematic illustration showing a structure during the formation of a second protective layer of a semiconductor device according to an exemplary embodiment of the disclosure.
Figure 5C:
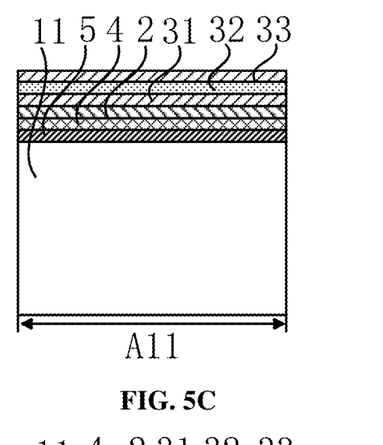
FIG. 5C is a third schematic illustration showing a structure during the formation of a second protective layer of a semiconductor device according to an exemplary embodiment of the disclosure.
Figure 5D:
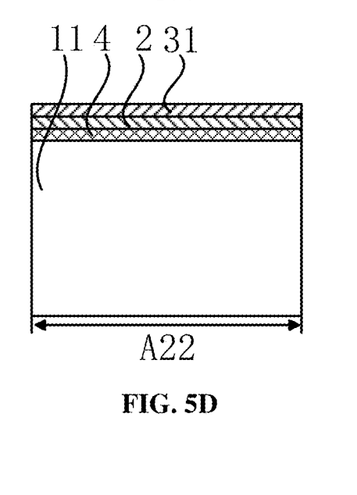
FIG. 5D is a fourth schematic illustration showing a structure during the formation of a second protective layer of a semiconductor device according to an exemplary embodiment of the disclosure.
Figure 5E:
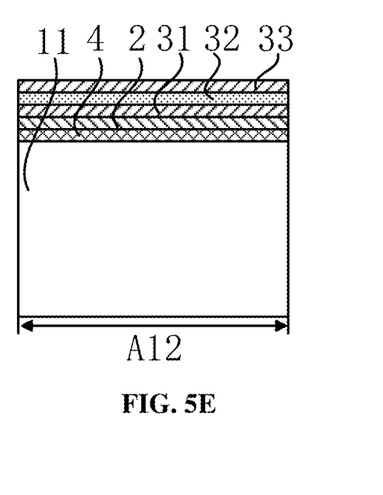
FIG. 5E is a fifth schematic illustration showing a structure during the formation of a second protective layer of a semiconductor device according to an exemplary embodiment of the disclosure.
Figure 6A:
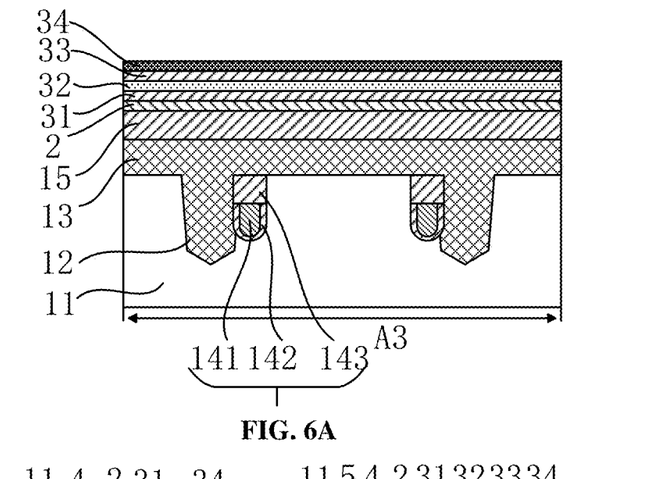
FIG. 6A is a first schematic illustration showing a structure during the formation of a second work function layer of a semiconductor device according to an exemplary embodiment of the disclosure.
Figure 6B:
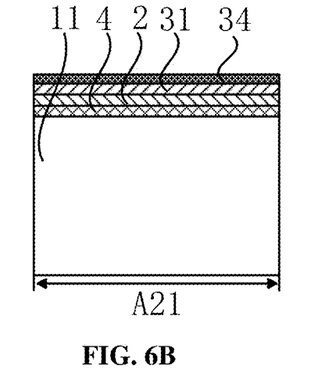
FIG. 6B is a second schematic illustration showing a structure during the formation of a second work function layer of a semiconductor device according to an exemplary embodiment of the disclosure.
Figure 6C:
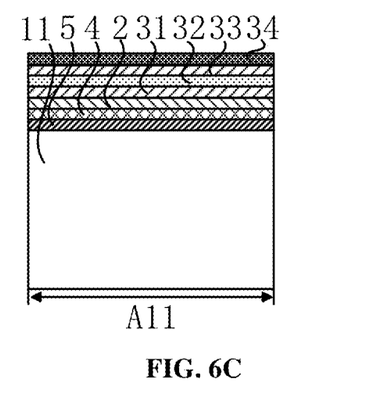
FIG. 6C is a third schematic illustration showing a structure during the formation of a second work function layer of a semiconductor device according to an exemplary embodiment of the disclosure.
Figure 6D:
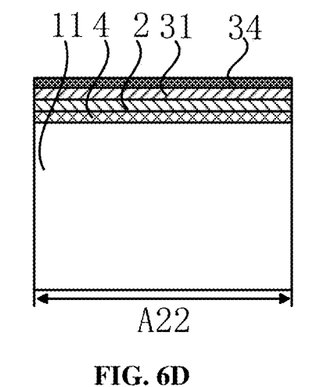
FIG. 6D is a fourth schematic illustration showing a structure during the formation of a second work function layer of a semiconductor device according to an exemplary embodiment of the disclosure.
Figure 6E:
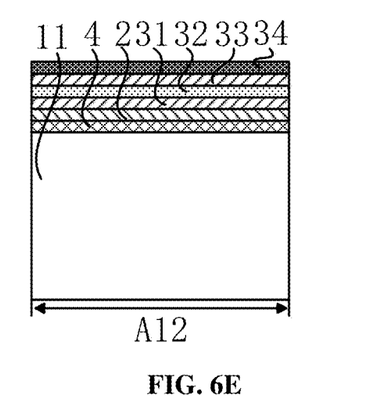
FIG. 6E is a fifth schematic illustration showing a structure during the formation of a second work function layer of a semiconductor device according to an exemplary embodiment of the disclosure.
Figure 7A:
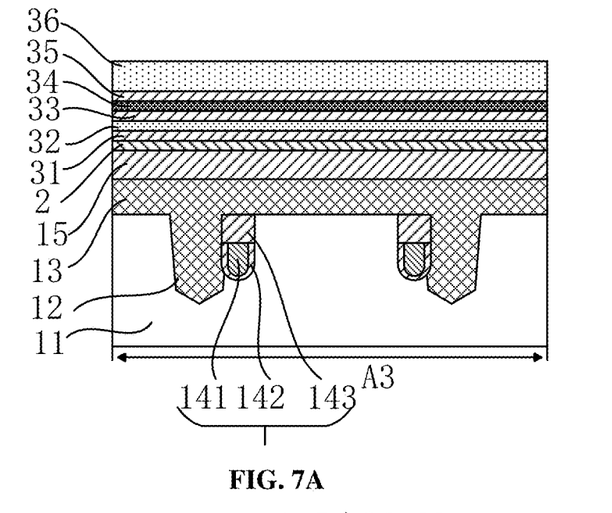
FIG. 7A is a first schematic illustration showing a structure during the formation of a third protective layer and a conductive layer of a semiconductor device according to an exemplary embodiment of the disclosure.
Figure 7B:
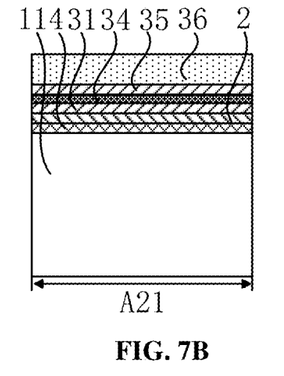
FIG. 7B is a second schematic illustration showing a structure during the formation of a third protective layer and a conductive layer of a semiconductor device according to an exemplary embodiment of the disclosure.
Figure 7C:
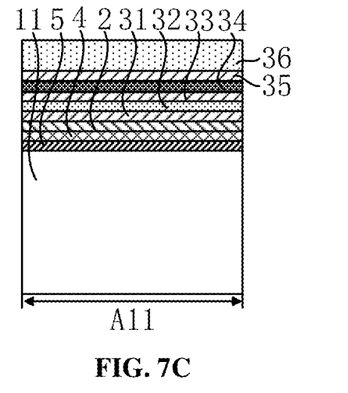
FIG. 7C is a third schematic illustration showing a structure during the formation of a third protective layer and a conductive layer of a semiconductor device according to an exemplary embodiment of the disclosure.
Figure 7D:
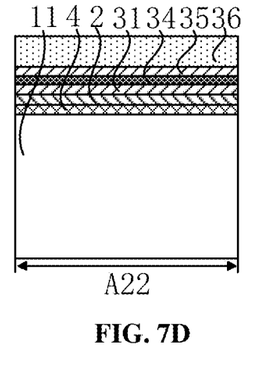
FIG. 7D is a fourth schematic illustration showing a structure during the formation of a third protective layer and a conductive layer of a semiconductor device according to an exemplary embodiment of the disclosure.
Figure 7E:
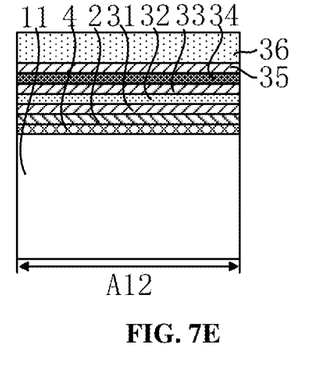
FIG. 7E is a fifth schematic illustration showing a structure during the formation of a third protective layer and a conductive layer of a semiconductor device according to an exemplary embodiment of the disclosure.
Figure 8A:
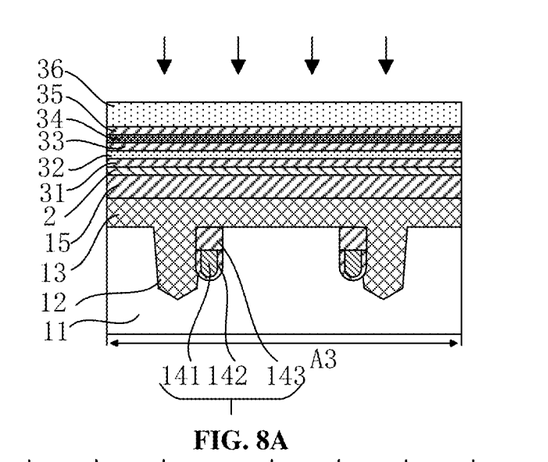
FIG. 8A is a first schematic illustration showing a first heat treatment process performed on a semiconductor device formed a conductive layer according to an exemplary embodiment of the disclosure.
Figure 8B:
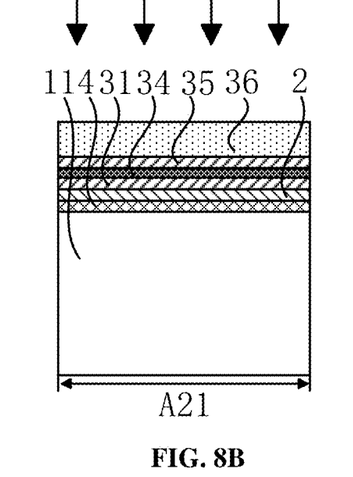
FIG. 8B is a second schematic illustration showing a first heat treatment process performed on a semiconductor device formed a conductive layer according to an exemplary embodiment of the disclosure.
Figure 8C:
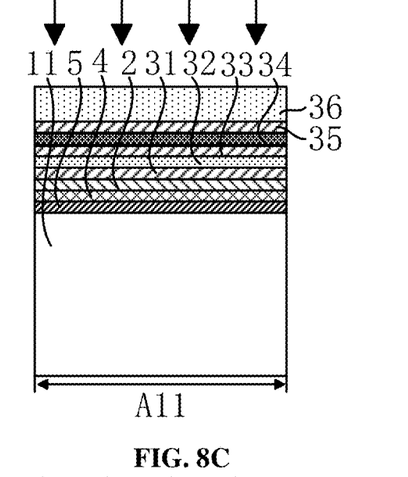
FIG. 8C is a third schematic illustration showing a first heat treatment process performed on a semiconductor device formed a conductive layer according to an exemplary embodiment of the disclosure.
Figure 8D:
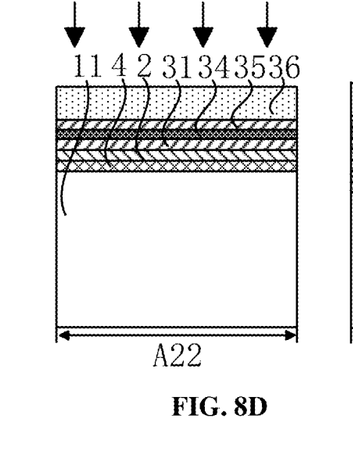
FIG. 8D is a fourth schematic illustration showing a first heat treatment process performed on a semiconductor device formed a conductive layer according to an exemplary embodiment of the disclosure.
Figure 8E:
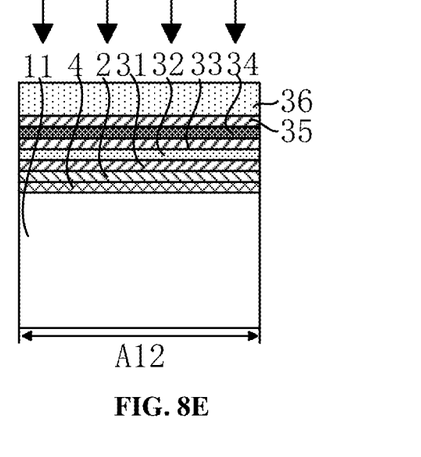
FIG. 8E is a fifth schematic illustration showing a first heat treatment process performed on a semiconductor device formed a conductive layer according to an exemplary embodiment of the disclosure.
Figure 9A:
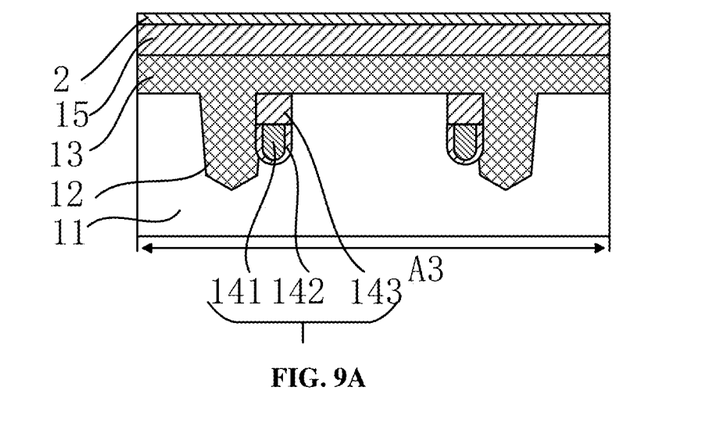
FIG. 9A is a first schematic illustration showing a structure of a semiconductor device in which a temporary layer is removed and a second heat treatment process is performed according to an exemplary embodiment of the disclosure.
Figure 9B:
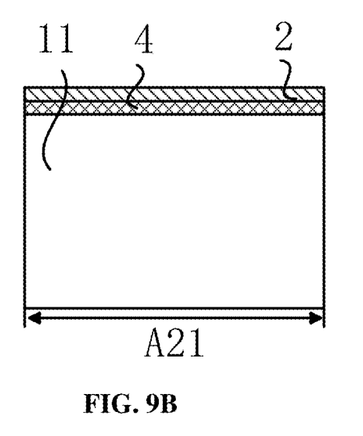
FIG. 9B is a second schematic illustration showing a structure of a semiconductor device in which a temporary layer is removed and a second heat treatment process is performed according to an exemplary embodiment of the disclosure.
Figure 9C:
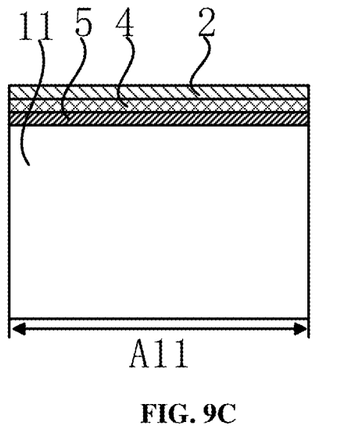
FIG. 9C is a third schematic illustration showing a structure of a semiconductor device in which a temporary layer is removed and a second heat treatment process is performed according to an exemplary embodiment of the disclosure.
Figure 9D:
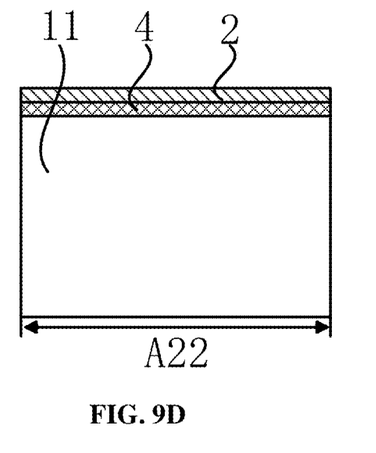
FIG. 9D is a fourth schematic illustration showing a structure of a semiconductor device in which a temporary layer is removed and a second heat treatment process is performed according to an exemplary embodiment of the disclosure.
Figure 9E:
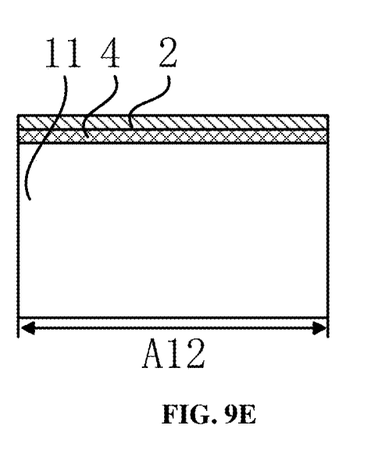
FIG. 9E is a fifth schematic illustration showing a structure of a semiconductor device in which a temporary layer is removed and a second heat treatment process is performed according to an exemplary embodiment of the disclosure.
Figure 10A:
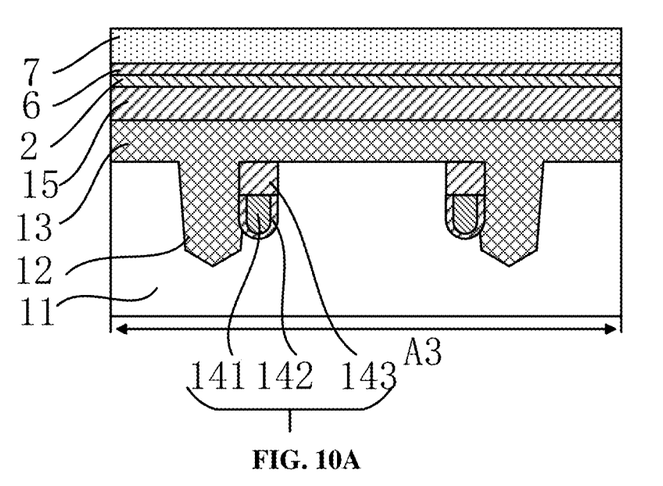
FIG. 10A is a first schematic illustration showing a structure during the formation of a barrier layer and a gate conductive layer of a semiconductor device according to exemplary embodiments of the disclosure.
Figure 10B:
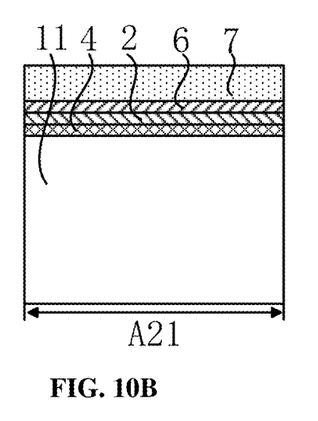
FIG. 10B is a second schematic illustration showing a structure during the formation of a barrier layer and a gate conductive layer of a semiconductor device according to exemplary embodiments of the disclosure.
Figure 10C:
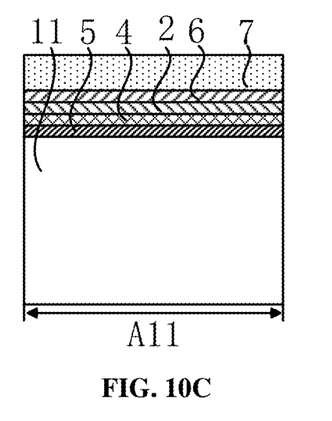
FIG. 10C is a third schematic illustration showing a structure during the formation of a barrier layer and a gate conductive layer of a semiconductor device according to exemplary embodiments of the disclosure.
Figure 10D:
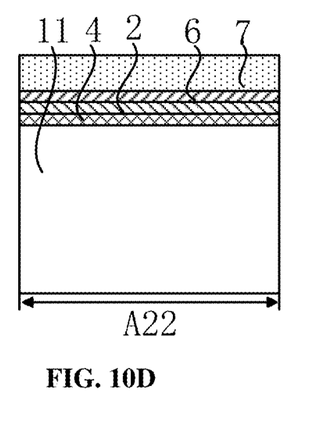
FIG. 10D is a fourth schematic illustration showing a structure during the formation of a barrier layer and a gate conductive layer of a semiconductor device according to exemplary embodiments of the disclosure.
Figure 10E:
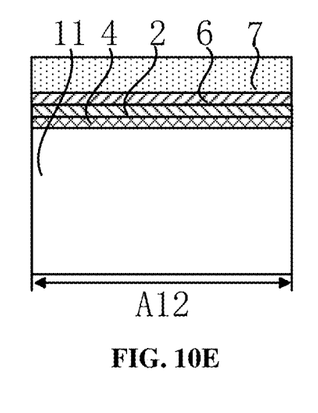
FIG. 10E is a fifth schematic illustration showing a structure during the formation of a barrier layer and a gate conductive layer of a semiconductor device according to exemplary embodiments of the disclosure.

In the embodiment of the disclosure, both the first region A1 and the second region A2 are located in the peripheral area. In some embodiments, the first region A1 is a PMOS region of the peripheral area, and the second region A2 is an NMOS region of the peripheral area. The threshold voltage of the PMOS is smaller than that of the NMOS. According to performance requirements, the peripheral area of the semiconductor has a plurality of NMOS regions and a plurality of PMOS regions, as shown in FIGS. 2A to 2E. In the embodiment of the disclosure, both FIGS. 2C and 2E show the PMOS region, i.e., the first region A1. FIG. 2C shows a first part A11 of the first region A1, and FIG. 2E shows a second part A12 of the first region A1. The first part A11 and the second part A12 of the first region A1 are located in different positions of the peripheral area, respectively. FIG. 2B shows a first part A21 of the second region A2, and FIG. 2D shows a second part A22 of the second region A2. The first part A21 and the second part A22 of the second region A2 are located in different positions of the peripheral area, respectively. FIG. 2A shows the array area A3 of the semiconductor substrate 11.

As an example, only the first part A11 and the second part A12 of the first region A1 and the first part A21 and the second part A22 of the second region A2 are shown in the embodiment of the disclosure. Of course, the first area A1 and the second region A2 may also include a third part and a fourth part, etc. respectively, and manufacturing methods thereof may correspond to methods for manufacturing the first parts A11 and A21 and the second parts A12 and A22, respectively, which will not be described here. In addition, it should be noted that, in order to clearly show the structure of each region in the manufacturing process, various regions are individually shown in the figures of this disclosure. It should be noted that the semiconductor devices are not necessarily arranged on the semiconductor substrate in the arrangements shown in FIGS. 2A to 10E.

At S400, a first dielectric layer 2 is formed on the semiconductor substrate 11.

In some embodiments, the first dielectric layer 2 may be formed on the semiconductor substrate 11 by a deposition process. The first dielectric layer 2 may be a high-k dielectric layer, and the material thereof may include at least one of aluminum oxide, tantalum pentoxide, yttrium oxide, hafnium silicon oxide, hafnium dioxide, lanthanum oxide, zirconium dioxide, strontium titanate or zirconium silicon oxide.

In some embodiments, as shown in FIGS. 2A to 2E, before forming the first dielectric layer 2 in the first region A1 and the second region A2, a second dielectric layer 4 may be formed on the semiconductor substrate 11. The dielectric constant of the second dielectric layer 4 may be smaller than that of the first dielectric layer 2. The material of the second dielectric layer 4 may be at least one of silicon nitride, silicon oxide or silicon oxynitride.

Before forming the first dielectric layer 2 in the array area A3, the following processing operations may be performed. Shallow trench isolations 12 are formed on the semiconductor substrate 11 located in the array area A3, and a barrier material layer 13 is formed on the semiconductor substrate 11. The shallow trench isolations 12 and the barrier material layer 13 may include at least one of silicon nitride, silicon oxide, or silicon carbide as the material thereof, and may be formed by the same deposition process. The word line structure 14 is embedded in the semiconductor substrate 11 in the array area A3, and includes at least a word line metal layer 141, a dielectric layer 142, and a word line isolation layer 143. The dielectric layer 142 is arranged on the sidewall of the word line metal layer 141. The material of the word line isolation layer 143 may include at least one of silicon nitride, silicon oxide or silicon carbonitride. The material of the word line metal layer 141 may include at least one of tungsten, titanium nitride, or polysilicon, which is not particularly limited here. An isolation layer 15 is formed on the barrier material layer 13. Therefore, as shown in FIGS. 2B-2E, in the embodiment of the disclosure, the second dielectric layer 4 and the first dielectric layer 2 are formed on the semiconductor substrate 11 in the first region A1 and second region A2 in sequence, and the barrier material layer 13, the isolation layer 15 and the first dielectric layer 12 are formed on the semiconductor substrate 11 in the array area A3 in sequence.

In some embodiments, as shown in FIGS. 2A to 2E, the method may further include an operation that before forming the second dielectric layer 4 on the semiconductor substrate 11, a strain layer 5 is formed on the semiconductor substrate 11 corresponding to at least part of the first region A1. As shown in FIG. 2C, the expression "at least part" may refer to the first part A11 of the first region A1. That is, the strain layer 5, the second dielectric layer 4 and the first dielectric layer 2 are formed on the semiconductor substrate 11 of the first part A11 of the first region A1 in sequence. The material of the strain layer 5 may be silicon germanium.

The first dielectric layer 2 and the second dielectric layer 4 may be used as a gate oxide layer at the same time. The first dielectric layer 2 is the high-k dielectric layer, which can improve dielectric constant, improve thermodynamic stability, and reduce gate leakage current. Moreover, the first dielectric layer 2 can play an isolation role, preventing the metal of the work function layer from diffusing into the semiconductor substrate 11. The second dielectric layer 4 is arranged under the first dielectric layer 2, which can further reduce the gate leakage current. In addition, the second dielectric layer 4 can also play an isolation role, and further prevent metal ions from being doped into the semiconductor substrate 11, thereby ensuring the stability of the performance of the semiconductor device. With respect to different regions, at least one of the second dielectric layer 4 or the strain layer 5 is arranged between the semiconductor substrate 11 and the first dielectric layer 2. The strain layer 5 can adjust electron mobility, thereby further ensuring the stability of the semiconductor device.

At S600, a temporary layer 3 is formed on the first dielectric layer 2. The formation of the temporary layer includes the following steps.

At S602, a first protective layer 31 is formed on the first dielectric layer 2.

As shown in FIGS. 2A to 2E, the first protective layer 31 is formed on the first dielectric layer 2 located in the array area A3, the first region A1 and the second region A2 of the semiconductor substrate 11. The first protective layer 31 may be formed by a deposition process. The material of the first protective layer 31 may be at least one of a metal nitride, a metal carbide, or a metal. For example, the metal nitride may be TiN or TaN, the metal carbide may be TaC, and the metal may be Ti, Ta, Co or Ru. Of course, those skilled in the art may also choose other materials according to actual requirements, and there is no special limitation here. By providing the first protective layer 31 on the first dielectric layer 2, the first dielectric layer 2 can be separated from a film layer formed in the subsequent process. That is, this layer acts as isolation. In addition, it is beneficial to prevent the first dielectric layer 2 from being damaged during the subsequent removal of the temporary layer 3.

At S604, a first work function layer 32 and a second protective layer 33 are formed on the first protective layer 31 located in the first region A1 in sequence.

In some embodiments, S604 may include an operation that a first work function layer 32 and a second protection layer 33 may be deposited on the first protection layer 31 in the first region A1, the second region A2 and the array area A3 in sequence. As shown in FIGS. 3A-3E, the first work function layer 32 is deposited on the first protective layer 31 located in the first region A1, the second region A2 and the array area A3. The material of the first work function layer 32 may be a P-type work function material, specifically includes at least one of AlO, TiN, TaN, TiSiN or TaSiN. In the embodiment, the material of the first work function layer 32 may be AlO.

As shown in FIGS. 4A to 4E, a second protective layer 33 may be formed on the first work function layer 32 by the deposition process. The material of the second protective layer 33 may be the same as that of the first protective layer 31, and the material of the second protective layer 33 may be at least one of the metal nitride, the metal carbide, or the metal. For example, the metal nitride may be TiN or TaN, the metal carbide may be TaC, and the metal may be Ti, Ta, Co or Ru. The first work function layer 32 can be sandwiched between the first protective layer 31 and the second protective layer 33 to protect and isolate the first work function layer 32.

As shown in FIGS. 5A to 5E, the first work function layer 32, and the second protective layer 33 are removed from the second region A2. That is, the first work function layer 32 and the second protective layer 33 are only formed on the first protective layer 31 located in the first region A1 and the array area A3.

The removal of the first work function layer 32 and the second protective layer 33 located in the second region A2 may be performed by a wet etching process.

In other embodiments, S604 may include operations that a first work function layer 32 is formed only on the first protective layer 31 located in the first region A1 and the array area A3, and a second protective layer 33 is formed on the first work function layer 32. In the operations, in order to form the first work function layer 32 only in the first region A1, a corresponding mask may be used in the deposition process, or an epitaxial growth process or a thermal oxygen growth process may be used, which is not particularly limited here.

At S606, a second work function layer 34 and a third protection layer 35 are formed on the first protection layer 31 located in the second region A2 and the second protection layer 33 located in the first region A1 in sequence.

As shown in FIGS. 6A to 6E, a second work function layer 34 may be formed in the first region A1, the second region A2 and the array area A3 on the semiconductor substrate 11 by the deposition process. The material of the second work function layer 34 may be an N-type work function material, and may include at least one of LaO, TiAl, TaAl, TiAlC, AN, TiAlN or TaAlN. In this embodiment, the material of the second work function layer 34 may be LaO.

As shown in FIGS. 7A to 7E, a third protective layer 35 is formed on the second work function layer 34 located in the first region A1, the second region A2 and the array area A3. The material of the third protective layer 35 may be the same as that of the first protective layer 31 or the second protective layer 33, and may be at least one of the metal nitride, the metal carbide, or the metal. For example, the metal nitride may be TiN or TaN, the metal carbide may be TaC, and the metal may be Ti, Ta, Co, or Ru.

At S608, a conductive layer 36 is formed on the third protective layer 35 to form the temporary layer 3.

Continue to refer to FIGS. 7A to 7E, the conductive lay 36 is formed on the third protective layer 35 located in the first region A1, the second region A2 and the array area A3. The material of the conductive lay 36 may be polysilicon, tungsten, nickel, or titanium nitride. The conductive layer 36 may be formed by the deposition process. Therefore, it is avoided that elements diffuse into the second work function layer 34 during the formation of the conductive layer 36 by forming the third protective layer 35 between the conductive layer 36 and the second work function layer 34, which ensures the purity of the second work function layer 34, and prevents the second work function layer 34 from being damaged. Therefore, the temporary layer 3 is formed by the first protective layer 31, the first work function layer 32, the second protective layer 33, the second work function layer 34, the third protective layer 35 and the conductive layer 36 located in the first region A1 and the array area A3 respectively, and the first protective layer 31, the second work function layer 34, the third protective layer 35 and the conductive layer 36 located in the second region A2.

At S800, a first heat treatment process is performed on the first dielectric layer 2 and the temporary layer 3.

As shown in FIGS. 8A to 8E, the first heat treatment is performed on the semiconductor substrate 11 having the temporary layer 3. That is, the first heat treatment process is performed on the temporary layer 3 located in the first region A1, the second region A2 and the array area A3 simultaneously. During the first heat treatment process, the temperature is firstly increased and then decreased within a preset range. The preset temperature range of the first heat treatment process is 500° C. to 1,000° C. Specifically, the temperature may be 550° C., 600° C., 650° C., 700° C., 800° C., 900° C., or 950° C., which may be adjusted within this temperature range according to the actual requirements, and is no special limitation here. A gas used in the first heat treatment process may include at least one of $N_2$ or $O_2$.

In some embodiments, $N_2$ may be introduced under a temperature of 500° C. to 1,000° C. at a flow rate of 10,000 sccm to 30,000 sccm (standard ml/min), such as 15,000 sccm, 20,000 sccm or 25,000 sccm for 1 sec to 6 sec (second). For example a time of introducing $N_2$ may be 2 sec, 3 sec, 4 sec, or 5 sec. Then the temperature may be at a rate of 65° C./sec to 90° C./sec, increased to a preset temperature less than 1,000° C., such as 700° C., 750° C., 800° C., 850° C., 900° C., or 950° C. Specifically, the temperature may be increased at 75° C./sec, 80° C./sec, 85° C./sec, or 90° C./sec. During the increase of the temperature, $N_2$ is introduced at the flow rate of 10,000 sccm to 30,000 sccm, such as 15,000 sccm, 20,000 sccm or 25,000 sccm, and $O_2$ is introduced at a flow rate of 500 sccm to 800 sccm, such as 600 sccm, 650 sccm, 700 sccm or 750 sccm. Then, at the present temperature reached, heating is continuously performed for 6 sec to 12 sec, such as 7 sec, 8 sec, 9 sec, 10 sec, or 11 sec. During this period, the flow rate of $N_2$ is maintained at 10,000 sccm to 30,000 sccm, such as 15,000 sccm, 20,000 sccm or 25,000 sccm, and the flow rate of $O_2$ is maintained at 500 sccm to 800 sccm, such as 600 sccm, 650 sccm, 700 sccm, or 750 sccm.

In one embodiment, $N_2$ may be introduced under 550° C. at the flow rate of 20,000 sccm for 2 sec (second), and then the temperature is increased from 550° C. to 950° C. at the rate of 75° C./sec. During the increase of the temperature, the flow rate of $N_2$ is maintained at 20,000 sccm, and $O_2$ is introduced at a flow rate of 650 sccm, and the heating is continuously performed under 950° C. for 10 sec. During this period, the flow rate of $N_2$ is maintained at 20,000 sccm, and the flow rate of $O_2$ is maintained at 650 sccm.

Upon the first heat treatment process, elements of the material of the first work function layer 32 can be permeated into the first dielectric layer 2 located in the first region A1 and the array area A3, and elements of the material of the second work function layer 34 can be permeated into the first dielectric layer 2 located in the second region A2. In some embodiments, the first heat treatment process may be Drive in process, which is not particularly limited here.

In addition, the first work function layer 32 and the second work function layer 34 are formed in the first region A1 and the array area A3 of the semiconductor substrate 11, and the second work function layer 34 is above the first work function layer 32. Therefore, during the first heat treatment process, the second protective layer 33 plays a barrier role, as it is located between the first work function layer 32 and the second work function layer 34. That is, the second protective layer 33 can block the material of the second work function layer 34 from permeating into the first dielectric layer 2 located in the first region A1 and the array area A3. In order to achieve a better barrier role, in some embodiments, ratios of various elements of the material of the second protective layer 33 may be adjusted. For example, when the material of the second protective layer 33 is titanium nitride, a ratio of titanium element to nitrogen element thereof may be adjusted, so as to better block the material of the second work function layer 34. In some embodiments, the thickness of the second protective layer 33 may also be adjusted, and the thickness of the second protective layer 33 is greater than that of the first protective layer 31. For example, the thickness of the second protective layer 33 may be twice, three times or four times that of the first protective layer 31 to effectively block the permeation of the material of the second work function layer 34.

At S1000, the temporary layer 3 is removed to expose the first dielectric layer 2.

As shown in FIGS. 9A to 9E, that temporary layer 3 located in the first region A1, the second region A2 and the array area A3 may be removed by an etching process. The conductive layer 36 and the third protective layer 35 may be removed by a dry etching process. In some embodiments, the material of the conductive layer 36 may include polysilicon, and the material of the third protective layer 35 may include titanium nitride. Etching gas used for removing the conductive layer 36 may include a hydrogen halide, such as at least one of HBr or HCl. A bias voltage used therein may be adjusted to 100V-140V, such as 110V, 120V, and 130V. Etching gas used for removing the third protective layer 35 may include halogen molecules, for example, at least one of chlorine or bromine. A bias voltage used therein may be adjusted to 0 to 10 V, such as 1V, 2V, 5V, or 8V, which is not particularly limited here. In this way, the conductive layer 36 and the third protective layer 35 can be accurately removed. Of course, in this dry etching process, the bias voltage may be adjusted by those skilled in the art, and there is no special limitation here.

In some embodiments, after removing the conductive layer 36 and the third protective layer 35, the first work function layer 32, the second protective layer 33, the second work function layer 34 and the first protective layer 31 may be removed by a wet etching process.

In some embodiments, the first work function layer 32 and the second protective layer 33 may be removed by using a first etching agent. The first etching agent may be a SC1 solution in which ammonia:hydrogen peroxide:water=1:(1 to 3):50, such as ammonia:hydrogen peroxide:water=1:2:50, and an etching temperature may be controlled at 45° C. to 60° C. For example, the etching temperature may be 50° C. or 55° C.

After removing the first work function layer 32 and the second protective layer 33, the second work function layer 34 may be removed by using a second etching agent. The second etching agent may be a halogen acid solution, such as hydrogen chloride solution or hydrogen bromide solution.

After removing the second work function layer 34, the first protective layer 31 may be removed by using a third etching agent. In some embodiments, the third etching agent may be the same as the first etching agent, and the etching temperature may be also the same. Those skilled in the art may make corresponding adjustments according to the material and thickness of the first protective layer 31, and there is no special limitation here. In this way, the temporary layer 3 is removed to expose the first dielectric layer 2.

It should be noted that, since by-products may be formed when the third protective layer 35 is removed, and these by-products may adhere to the surface of the first work function layer 32 and may affect the removal of the first work function layer 32 by the wet etching process, it is necessary to remove the by-products before removing the first work function layer 32 by the wet etching process. In some embodiments, the by-products may be removed by using a mixture of $H_2$ and $N_2$ in which the mass percentage of $N_2$ is greater than that of $H_2$. Specifically, for the mixture of $H_2$ and $N_2$, the mass percentage of $N_2$ may be 90% to 97%. Specifically, the mass percentage of $N_2$ may be 92%, 94%, or 96%, which is not particularly limited here. A process for removing the by-products by using $H_2$ and $N_2$ may be the dry etching process.

At S1200, a second heat treatment process is performed on the first dielectric layer 2.

After removing the first protective layer 31 by the etching process, elements of the etching agent may be retained in the first dielectric layer 2 due to the influence of the etching agent. For example, elements such as hydrogen, halogen and oxygen may be retained in the first dielectric layer 2, and thus these impurity elements lead to the impurity of the first dielectric layer 2, which affects the performance of the semiconductor device including the first dielectric layer 2. In addition, the wet etching process may also damage the surface of the first dielectric layer 2, resulting in interface defects, which affects the stability of other functional film layers formed on the first dielectric layer 2 in the subsequent process.

In some embodiments of the disclosure, the second heat treatment process is performed on the exposed first dielectric layer 2. The temperature of the second heat treatment process is 500° C. to 650° C. In some embodiments, the temperature of the second heat treatment process is a preset constant value. Specifically, the preset constant value of the temperature of the second heat treatment process is in a range of 500° C. to 650° C. For example, the temperature of the second heat treatment process may be 550° C. or 600° C., which is not particularly limited here. In addition, the temperature of the second heat treatment process is less than the maximum temperature of the first heat treatment process. In some embodiments, the temperature of the second heat treatment process is 550° C., and the maximum temperature of the first heat treatment process is 950° C.

In some embodiments, a gas used in the second heat treatment process may include at least one of $NH_3$, $H_2$, Ar or He. The flow rate of $NH_3$ may be 300 sccm to 600 sccm, such as 400 sccm, 450 sccm, 500 sccm or 550 sccm, the flow rate of $H_2$ may be 800 sccm to 1,300 sccm, such as 900 sccm, 1,000 sccm, 1,100 sccm or 1,200 sccm, the flow rate of Ar may be 800 sccm to 1,300 sccm, such as 900 sccm, 1,000 sccm, 1,100 sccm or 1,200 sccm, and the flow rate of He may be 800 sccm to 1,300 sccm, such as 900 sccm, 1,000 sccm, 1,100 sccm or 1,200 sccm. For the second heat treatment process, the treatment time may be 150 sec to 200 sec, such as 160 sec to 180 sec, the pressure may be kept at 20 Pa to 50 Pa, the radio-frequency power may be 500 W to 800 W, such as 600 W or 700 W, and the radio frequency time may be 150 sec to 200 sec, such as 160 sec to 180 sec. For the above parameters of the second heat treatment process, those skilled in the art may adjust them according to the actual needs, and there is no special limitation here.

During the second heat treatment process on the first dielectric layer 2, it is possible to remove hydrogen, halogen and oxygen elements doped in the first dielectric layer 2, and supplement nitrogen element, so as to improve the purity of the first dielectric layer 2, reduce the interface defects of the first dielectric layer 2, and make the performance of the first dielectric layer 2 more stable.

At S1400, a barrier layer 6 is formed on the first dielectric layer 2.

As shown in FIGS. 10A to 10E, after performing the second heat treatment process on the first dielectric layer 2, the barrier layer 6 may be formed on the first dielectric layer 2 located in the first region A1, the second region A2 and the array area A3 by using a deposition process. The material of the barrier layer 6 may be at least one of a metal nitride, a metal carbide, or a metal. For example, the metal nitride may be TiN or TaN, the metal carbide may be TaC, and the metal may be Ti or Ta. In one embodiment, the material of the barrier layer 6 may be TiN.

At S1600, a gate conductive layer 7 is formed on the barrier layer 6. Continue to refer to FIGS. 10A to 10E, the gate conductive layer 7 may be formed on the barrier layer 6 by using a deposition process. The material of the gate conductive layer 7 may include polysilicon, titanium nitride, tungsten, or nickel. In this way, the semiconductor device with a high k metal gate is formed.

For the method for manufacturing a semiconductor device according to the embodiment of the disclosure, it is avoided that the work function layer is directly formed on the first dielectric layer 2 by forming the first protective layer 31 on the first dielectric layer 2, which protects the first dielectric layer 2, and makes it easier to remove the temporary layer 3 in the subsequent process. It can be avoided that the second work function layer 34 located in the first region A1, during the first heat treatment process, diffuses into the first dielectric layer 2 located in the first region A1 by forming the second protective layer 33 on the first work function layer 32, which ensures the purity of the first work function layer 32. In addition, the second heat treatment process is performed on the first dielectric layer 2, which can repair the first dielectric layer 2, reduce interface defects, and improve the purity of the first dielectric layer, thereby ensuring the performance stability of the semiconductor device and improving the yield rate of the semiconductor device.

According to another aspect of the disclosure, a semiconductor device is provided, and is manufactured by the method of any of the above embodiments. The semiconductor device of an embodiment of the disclosure has a more stable performance and a higher yield.

It should be understood that the application of this disclosure is not limited to the detailed structure and arrangement of components proposed in the specification. The disclosure can be implemented in other embodiments, and realized and executed in various forms. The foregoing variations and modifications fall within the scope of this disclosure. It should be understood that the disclosure disclosed and defined in this specification extends to all alternative combinations of two or more individual features mentioned or apparently in the text and/or the drawings. All these different combinations constitute alternative aspects of the disclosure. The embodiments described in this specification illustrate the best mode known for realizing this disclosure, and will enable those skilled in the art to make use of this disclosure.

What is claimed is:

1. A method for manufacturing a semiconductor device, comprising:
   providing a semiconductor substrate comprising a first region and a second region;
   forming a first dielectric layer on the semiconductor substrate;
   forming a temporary layer on the first dielectric layer, wherein the formation of the temporary layer comprises:
   forming a first protective layer on the first dielectric layer;
   forming a first work function layer and a second protective layer on the first protective layer located in the first region in sequence;
   forming a second work function layer and a third protective layer on the first protective layer located in the second region and the second protective layer located in the first region in sequence; and
   forming a conductive layer on the third protective layer;
   performing a first heat treatment process on the first dielectric layer and the temporary layer;
   removing the temporary layer to expose the first dielectric layer; and
   performing a second heat treatment process on the first dielectric layer.

2. The method of claim 1, wherein the formation of the first work function layer and the second protective layer on the first protective layer located in the first region in sequence comprises:
   forming the first work function layer and the second protective layer on the first protective layer located in the first region and the second region in sequence; and
   removing the first work function layer and the second protective layer from the second region.

3. The method according to claim 1, wherein
   the first heat treatment process is performed by firstly increasing a temperature and then decreasing the temperature within a preset range; and
   the second heat treatment process is performed under a temperature with a preset constant value;
   wherein the temperature of the second heat treatment process is less than a maximum temperature of the first heat treatment process.

4. The method according to claim 1, wherein a temperature of the first heat treatment process is 500° C. to 1,000° C., and a temperature of the second heat treatment process is 500° C. to 650° C.

5. The method according to claim 1, wherein a gas used in the first heat treatment process comprises at least one of $N_2$ or $O_2$, and a gas used in the second heat treatment process comprises at least one of $NH_3$, $H_2$, Ar, or He.

6. The method according to claim 5, wherein in the first heat treatment process, a flow rate of $N_2$ is 10,000 sccm to 30,000 sccm, and a flow rate of $O_2$ is 500 sccm to 800 sccm.

7. The method according to claim 1, before forming the first dielectric layer on the semiconductor substrate, further comprising,
   forming a second dielectric layer on the semiconductor substrate, wherein the second dielectric layer has a dielectric constant smaller than a dielectric constant of the first dielectric layer.

8. The method according to claim 7, before forming the second dielectric layer on the semiconductor substrate, further comprising,
   forming a strain layer on the semiconductor substrate corresponding to at least part of the first region.

9. The method according to claim 1, wherein the first protective layer, the second protective layer and the third protective layer have same materials that comprise at least one of a metal nitride, a metal carbonitride, or a metal.

10. The method of claim 1, wherein the second protective layer has a thickness greater than a thickness of the first protective layer.

11. The method of claim 1, wherein the removal of the temporary layer comprises:

removing the conductive layer and the third protective layer by a dry etching process, and removing the first work function layer, the second protective layer, the second work function layer and the first protective layer by a wet etching process.

12. The method of claim 11, wherein a material of the conductive layer comprises polysilicon, and a material of the third protective layer comprises titanium nitride;

wherein an etching gas used for removing the conductive layer comprises a hydrogen halide; and an etching gas used for removing the third protective layer comprises halogen molecules.

13. The method according to claim 12, before removing the first work function layer, the second protective layer, the second work function layer and the first protective layer by the wet etching process, further comprising, removing by-products formed when removing the third protective layer, by using $H_2$ and $N_2$, wherein a mass percentage of $N_2$ is greater than a mass percentage of $H_2$.

14. The method according to claim 1, wherein the semiconductor substrate comprises a peripheral area and an array area, and the first region and the second region are located in the peripheral area; and the first region is a PMOS region, the second region is an NMOS region, and the PMOS region has a threshold voltage smaller than a threshold voltage of the NMOS region.

15. The method according to claim 1, after performing the second heat treatment process on the first dielectric layer, further comprising, forming a barrier layer on the first dielectric layer, and forming a gate conductive layer on the barrier layer.

* * * * *